United States Patent
Im et al.

(10) Patent No.: US 7,672,184 B2
(45) Date of Patent: Mar. 2, 2010

(54) SEMICONDUCTOR MEMORY DEVICE WITH REFRESH SIGNAL GENERATOR AND ITS DRIVING METHOD

(75) Inventors: Jae-Hyuk Im, Kyoungki-do (KR); Chang-Ho Do, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 208 days.

(21) Appl. No.: 11/824,429

(22) Filed: Jun. 29, 2007

(65) Prior Publication Data

US 2008/0159039 A1    Jul. 3, 2008

(30) Foreign Application Priority Data

Jan. 3, 2007    (KR) .................. 10-2007-0000391

(51) Int. Cl.
*G11C 11/406*    (2006.01)
(52) U.S. Cl. .................. 365/222; 365/189.09; 365/202
(58) Field of Classification Search .......... 365/222, 365/189.09, 202
See application file for complete search history.

(56) References Cited

U.S. PATENT DOCUMENTS

| 5,315,557 | A | * | 5/1994 | Kim et al. ............... 365/222 |
| 5,446,697 | A | * | 8/1995 | Yoo et al. ............... 365/226 |
| 5,495,452 | A | * | 2/1996 | Cha .................... 365/222 |
| 6,288,963 | B1 | * | 9/2001 | Kato ................... 365/222 |
| 6,747,907 | B2 | * | 6/2004 | Mano et al. ............. 365/226 |
| 6,917,190 | B2 | * | 7/2005 | Matsuo et al. ........... 323/287 |
| 7,038,968 | B2 | | 5/2006 | Kim |
| 2005/0105352 | A1 | | 5/2005 | Lee |
| 2005/0228611 | A1 | | 10/2005 | Kim |
| 2006/0066386 | A1 | | 3/2006 | Hong |
| 2006/0087901 | A1 | | 4/2006 | Hong et al. |

FOREIGN PATENT DOCUMENTS

| KR | 10-0158478 | 8/1998 |
| KR | 0172234 | 10/1998 |
| KR | 10-0197562 | 2/1999 |
| KR | 10-2006-0071473 | 6/2006 |

* cited by examiner

*Primary Examiner*—J. H. Hur
(74) *Attorney, Agent, or Firm*—Blakely, Sokoloff, Taylor & Zafman

(57) ABSTRACT

A semiconductor memory device includes a level feedback circuit and a refresh signal generator. The level feedback circuit outputs a bulk voltage applied to a cell transistor as a feedback signal. The refresh signal generator generates an internal refresh signal for driving a refresh operation at predetermined intervals during a self refresh mode. A period of the internal refresh signal is adjusted according to a voltage level of the feedback signal.

11 Claims, 7 Drawing Sheets

SEMICONDUCTOR MEMORY DEVICE WITH REFRESH SIGNAL GENERATOR AND ITS DRIVING METHOD

CROSS-REFERENCE TO RELATED APPLICATION

The present invention claims priority of Korean patent application number 10-2007-0000391, filed on Jan. 3, 2007, which is incorporated by reference in its entirety.

BACKGROUND OF THE INVENTION

The present invention relates to semiconductor design technologies; and, more particularly, to a semiconductor memory device which is provided with a refresh device capable of minimizing power consumption by adjusting a refresh period depending on a level of an internal power.

Generally, basic operations of a semiconductor memory device include a write operation for storing data provided from outside and a read operation for outputting desired data stored therein upon request. In order to perform these write and read operations, the semiconductor memory device requires the capability of storing data provided from outside.

In particular, since DRAM (Dynamic Random Access Memory) is a nonvolatile memory, data stored therein is lost after a fixed amount of time elapses. Therefore, a refresh operation is needed to fully restore data stored in memory cells before the fixed amount of time in order to prevent the loss of data. This refresh operation has priority over any other operations within DRAM.

Such a refresh operation is done at a fixed period that is closely concerned with a retention time of cell data. More details of this will be given below with reference to a cross-sectional view of unit memory cell.

FIG. 1 is a cross-sectional view of unit memory cell, and particularly shows a leakage current in the unit memory cell.

As shown in FIG. 1, although a transistor is turned off, a leakage current occurs in a cell capacitor (here, it is assumed that logic high data is stored in the cell capacitor). Two major factors that cause the leakage current are an off current $I_{OFF}$ and a junction current $I_{JUN}$.

Meanwhile, an internal power VBB with a negative electric potential lower than a ground voltage is generally connected to a bulk of an NMOS transistor in unit memory cell shown in FIG. 1. By keeping the bulk bias low like this, the leakage current is reduced by setting a threshold voltage of transistor higher than that of a general NMOS. But, as a level of the internal power VBB lowers, the threshold voltage becomes higher to decrease off-current, whereas the leakage current increases by increase of junction-current. That is, the off-current and junction-current constituting the leakage current have a trade-off relationship depending on the level of the internal power VBB. Therefore, in order to lengthen a retention time of cell data, it is important to find the level of an optimal internal power VBB making both the off-current and junction-current smaller.

Now, a refresh device for refreshing cell data will be described.

FIG. 2 is a block diagram showing a configuration of a semiconductor memory device having a conventional refresh signal generator.

Referring to FIG. 2, the conventional semiconductor memory device includes a mode input/output controller 10 for generating an internal auto refresh signal AREFP, a self refresh entrance signal SREF_EN and a self refresh escape signal SREF_EXP based on a clock enable signal CKE and an auto refresh command AREF_CMD, a refresh interval signal generator 20 for generating a self refresh interval signal SREF notifying a self refresh interval by using the internal auto refresh signal AREFP, the self refresh entrance signal SREF_EN and the self refresh escape signal SREF_EXP, a refresh period signal generator 30 for periodically outputting a period-pulse signal PL_FLG during activation of the self refresh interval signal SREF, an internal refresh signal generator 40 for activating an internal refresh signal REFP in response to the internal auto refresh signal AREFP and the period-pulse signal PL_FLG, and an internal address counter 50 for increasing a row address by one bit unit in response to the internal refresh signal REFP to output an internal address RCNTI[0:N].

For reference, the clock enable signal CKE is a signal indicating whether a clock synchronizing the operation of a semiconductor memory device is valid or not. Thus, if only the clock enable signal CKE is inactivated, the semiconductor memory device enters a power-down mode for minimizing its own power consumption.

FIG. 3 shows an internal circuit diagram of the refresh period signal generator 30 of FIG. 2.

Referring to FIG. 3, the refresh period signal generator 30 includes a driving power supplier 32 for voltage-dividing a power supply voltage VDD and a ground voltage VSS to provide divided voltages as driving powers, an oscillator 34 which has an inverter chain and is active during activation of the self refresh interval signal SREF to generate a signal OSC_OUT at regular intervals depending on levels of the driving powers, and a pulse output circuit 36 for producing the output signal OSC_OUT of the oscillator 34 as the period-pulse signal PL_FLG of pulse type.

In brief operation, first of all, when the self refresh interval signal SREF is activated to a logic high level, the oscillator 34 generates the signal OSC_OUT at regular intervals. Here, the regular intervals are determined based on the voltage levels of the driving powers applied to the gate ends of NMOS transistors and PMOS transistors forming the inverter chain therein. As mentioned above, the driving powers are provided by voltage-dividing the power supply voltage VDD and the ground voltage VSS by the driving power supplier 32. Next, the pulse output circuit 36 senses a rising edge of the output signal OSC_OUT of the oscillator 32 to generate the period-pulse signal PL_FLG of pulse type.

Now, the operation of the semiconductor memory device having the conventional refresh signal generator shown in FIGS. 2 and 3 will be briefly described.

First, when the clock enable signal CKE is transited to a logic low level, the auto refresh command AREF_CMD is activated. Then, the mode input/output controller 10, in response to the transition of logic level of the clock enable signal CKE, activates the self refresh entrance signal SREF_EN, and, in response to an auto refresh command AR, activates the internal auto refresh signal AREFP.

Next, the internal refresh signal generator 40 generates the internal refresh signal REFP in response to the internal auto refresh signal AREFP. In succession, the internal address counter 50 increases the row address by one bit unit whenever the internal refresh signal REFP is activated, to output the internal address RCNTI[0:N].

Further, the refresh interval signal generator 20 activates the self refresh interval signal SREF in response to activation of the internal auto refresh signal AREFP and the self refresh entrance signal SREF_EN, wherein this activation is maintained until the self refresh escape signal SREF_EXP is applied.

Next, the refresh period signal generator 30 periodically activates the period-pulse signal PL_FLG during the activation of the self refresh interval signal SREF. And then, the internal refresh signal generator 40 activates a new internal refresh signal REFP of pulse type whenever the period-pulse signal PL_FLG is applied. The internal address generator 50 increases the row address by one bit unit whenever the internal refresh signal REFP is activated, to output the internal address RCNTI[0:N].

For reference, the internal refresh signal REFP is applied to each band, so that a word line corresponding to the internal address RCNTI[0:N] becomes active to perform self refresh.

Meanwhile, the refresh period by the refresh device within the conventional semiconductor memory device is determined by the period of the period-pulse signal PL_FLG. The period-pulse signal PL_FLG is generated to have a constant period regardless of the level of the internal power VBB. Therefore, although the level of the internal power VBB is optimized so that the retention time is reduced, it is not likely to reflect the above. As a result, this reduces the number of times of refresh and thus cannot reduce power consumption.

SUMMARY OF THE INVENTION

Embodiments of the present invention are directed to provide a semiconductor memory device for minimizing a current consumption by adjusting a refresh period according to a voltage level of an internal voltage.

In accordance with an aspect of the present invention, there is provided a semiconductor memory device including a level feedback circuit and a refresh signal generator. The level feedback circuit outputs a bulk voltage applied to a cell transistor as a feedback signal. The refresh signal generator generates an internal refresh signal for driving a refresh operation at predetermined intervals during a self refresh mode. A period of the internal refresh signal is adjusted according to a voltage level of the feedback signal.

In accordance with another aspect of the present invention, there is provided a semiconductor memory device including a refresh entrance/exit controller and a control signal generator. The refresh entrance/exit controller is for generating a self refresh interval signal notifying that the current operation is in a self refresh mode based on a clock enable signal and an auto refresh command. The control signal generator is for periodically generating an internal refresh signal and an internal address for refresh driving during activation of the self refresh interval signal, wherein an activation period of the internal refresh signal is varied and generated in response to a level of a bulk voltage applied to a cell transistor.

In accordance with a further another aspect of the present invention, there is provided a driving method of a semiconductor memory device including activating a self refresh interval signal notifying that the current operation is in a self refresh mode in response to a clock enable signal and an auto refresh command, and entering the self refresh mode; voltage-dividing a bulk voltage applied to a memory cell to feedback a divided bulk voltage; and generating an internal refresh signal and an internal address for controlling refresh driving at a period adjusted depending on a level of the feedback voltage during activation of the self refresh interval signal

DESCRIPTION OF SPECIFIC EMBODIMENTS

Hereinafter, preferred embodiments of the present invention will be described in detail with reference to the accompanying drawings so that the invention can be easily carried out by those skilled in the art.

Figure 1:
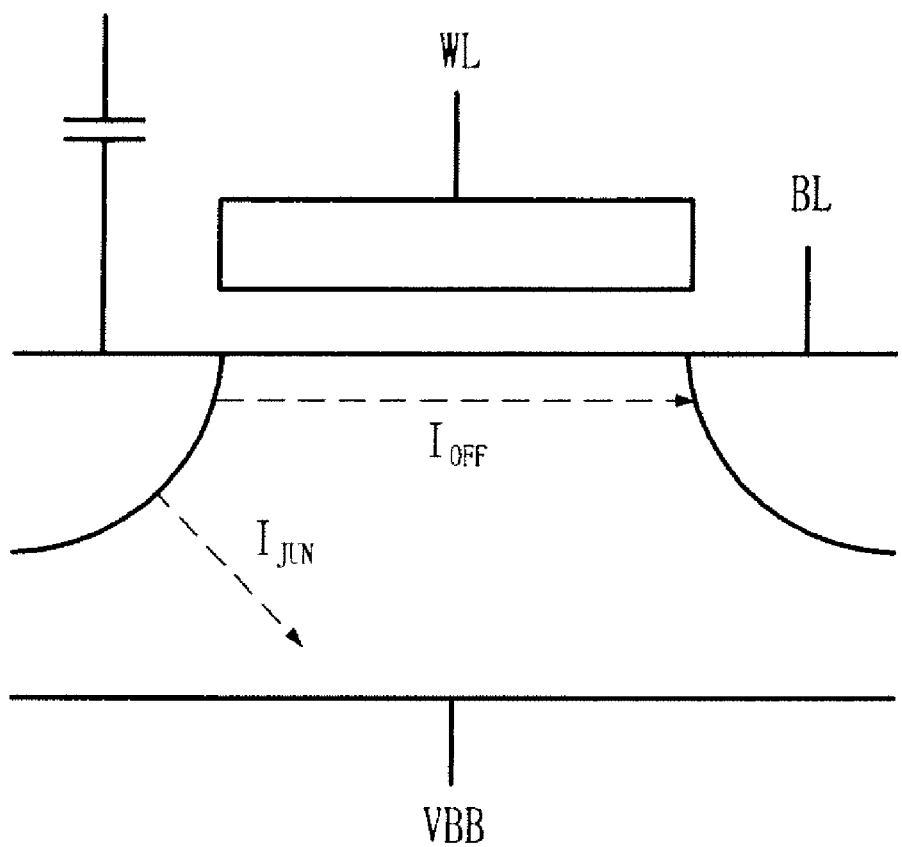
FIG. 1 is a cross-sectional view of unit memory cell, and particularly shows a leakage current in the unit memory cell.
Figure 2:
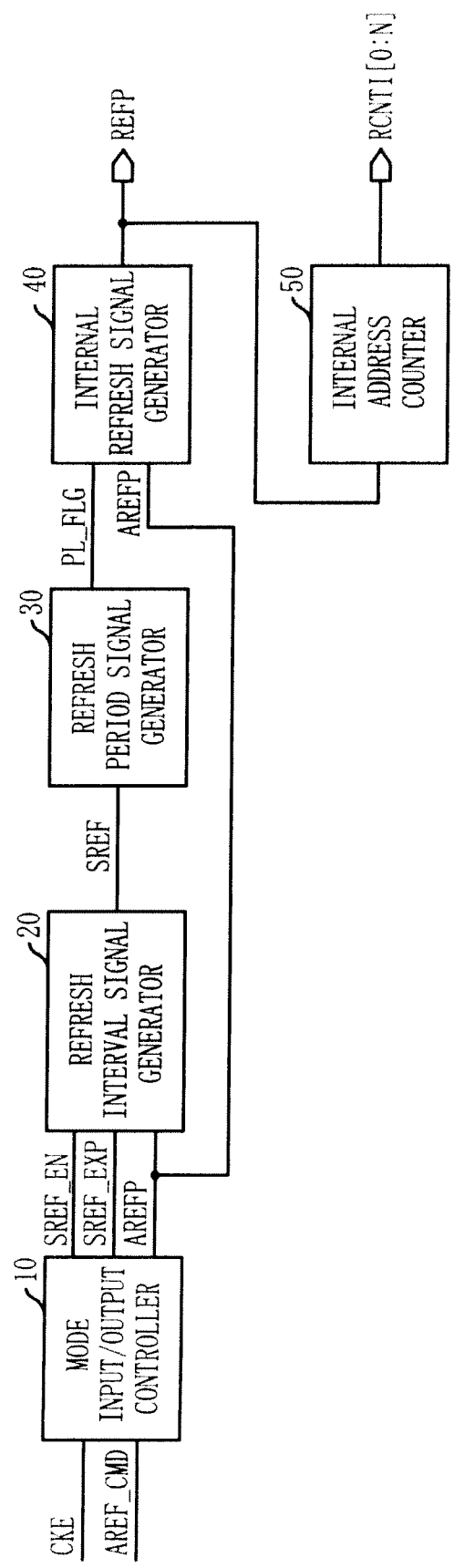
FIG. 2 is a block diagram showing a configuration of a semiconductor memory device having a conventional refresh signal generator.
Figure 3:
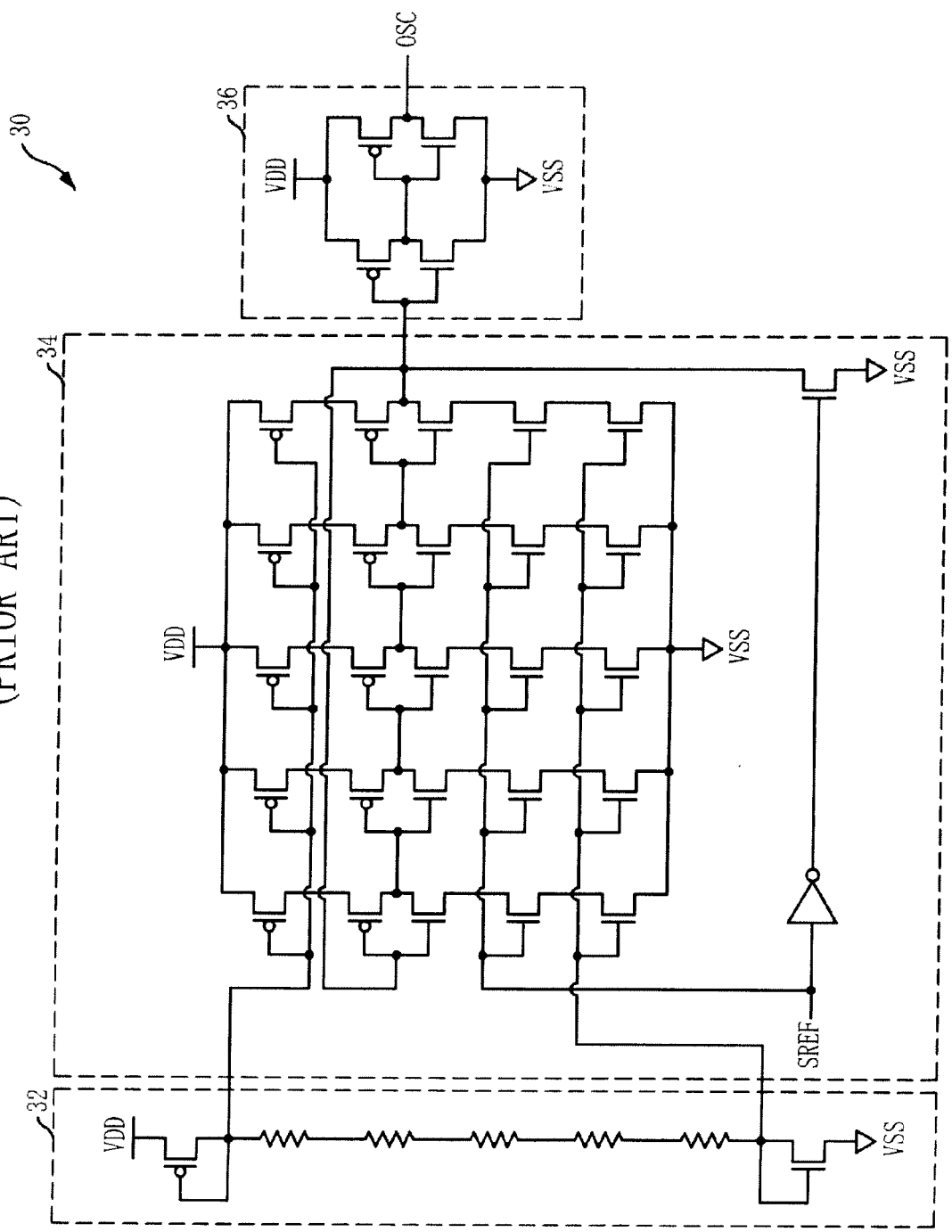
FIG. 3 shows an internal circuit diagram of the refresh period signal generator of FIG. 2.
Figure 4:
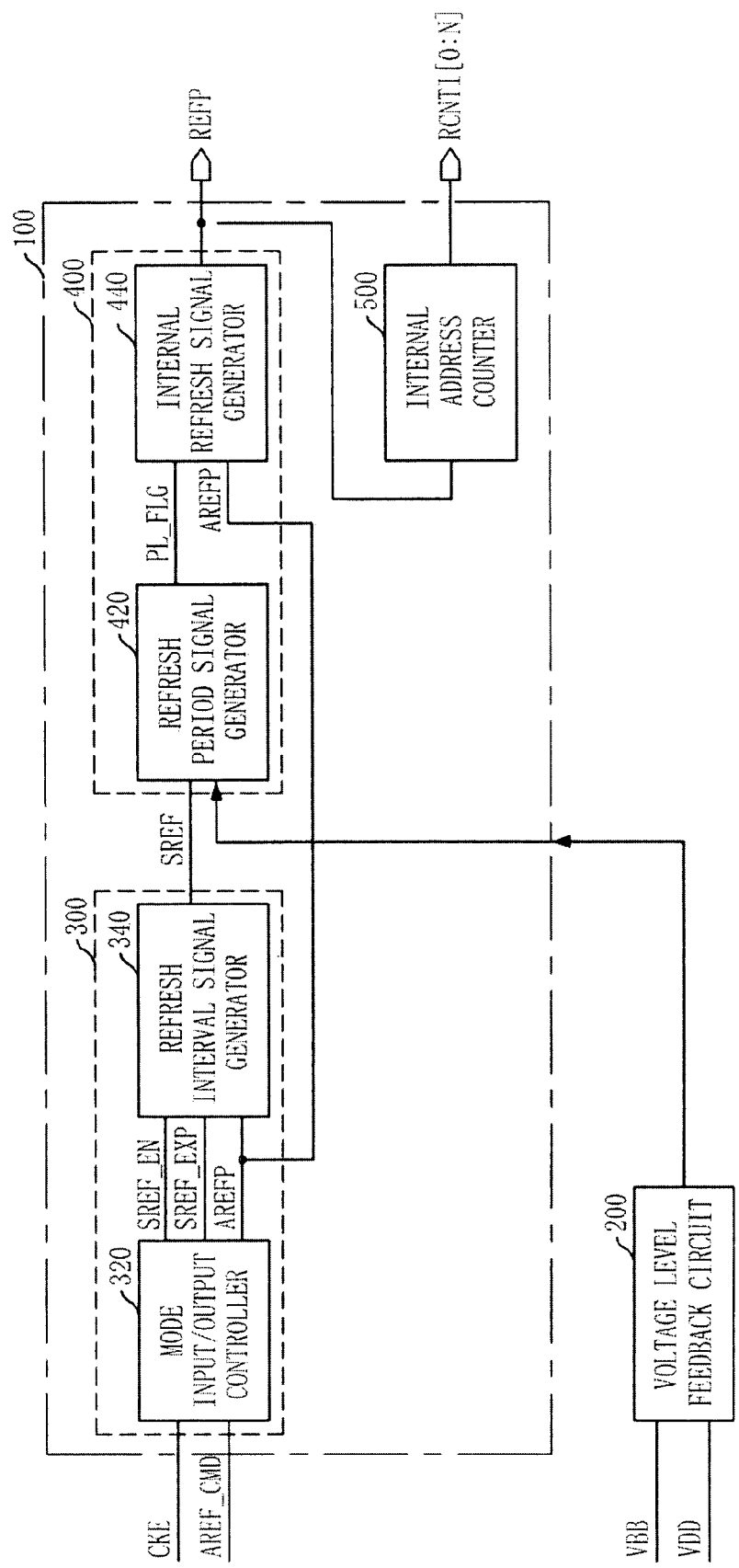
FIG. 4 is a block diagram illustrating a configuration of a semiconductor memory device having a refresh signal generator in accordance with a preferred embodiment of the present invention.

FIG. 4 is a block diagram illustrating a configuration of a semiconductor memory device having a refresh signal generator in accordance with a preferred embodiment of the present invention.

Referring to FIG. 4, the semiconductor memory device of the invention includes a refresh signal generator 100 for generating an internal refresh signal REFP for refresh driving at regular intervals during a self refresh mode wherein the period of the internal refresh signal is adjusted depending on a voltage level of a feedback signal, and a voltage level feedback circuit 200 for outputting a voltage level of an internal power VBB as the feedback signal.

The refresh signal generator 100 is provided with a refresh entrance/exit controller for generating a self refresh interval signal SREF notifying that the current operation is in a self refresh mode in response to a clock enable signal CKE and an auto refresh command AREF_CMD, and an internal auto refresh signal AREFP, and control signal generators 400 and 500 for periodically generating an internal refresh signal REFP and an internal address RCNTI[0:N] during activation of the self refresh interval signal SREF, wherein an activation period of the internal refresh signal REFP is varied and generated when a level of the internal power VBB applied to the memory cell is varied.

The refresh entrance/exit controller 300 is provided with a mode input/output controller 320 for generating an internal auto refresh signal AREFP, a self refresh entrance signal SREF_EN and a self refresh escape signal SREF_EXP based on the clock enable signal CKE and the auto refresh command AREF_CMD, and a refresh interval signal generator 340 for generating the self refresh interval signal SREF notifying the self refresh interval depending on the internal auto refresh signal AREFP, the self refresh entrance signal SREF_EN and the self refresh escape signal SREF_EXP.

The control signal generator 400 and 500 are provided with a refresh period signal generator 420 for periodically outputting a period-pulse signal PL_FLG during activation of the self refresh interval signal SREF wherein the period of the period-pulse signal is adjusted in accordance with the level of the feedback signal, an internal refresh signal generator 440 for activating the internal refresh signal REFP in response to the internal auto refresh signal AREFP and the period-pulse signal PL_FLG, and an internal address counter 500 for increasing a row address by one bit unit in response to the internal refresh signal REFP, to output the internal address RCNTI[0:N].

As mentioned above, the semiconductor memory device of the invention further includes the voltage level feedback circuit 200 for sensing the level of the internal power VBB to output the feedback signal, wherein the number of times of refreshes being executed during the self refresh mode is adjusted depending on the level of the feedback signal. Thus, IDD6, that is, the power being consumed during the self refresh mode can be reduced.

Hereinafter, a concrete embodiment of the voltage level feedback circuit 200 and the refresh period signal generator 420 will be described with reference to the drawings.

Figure 5:
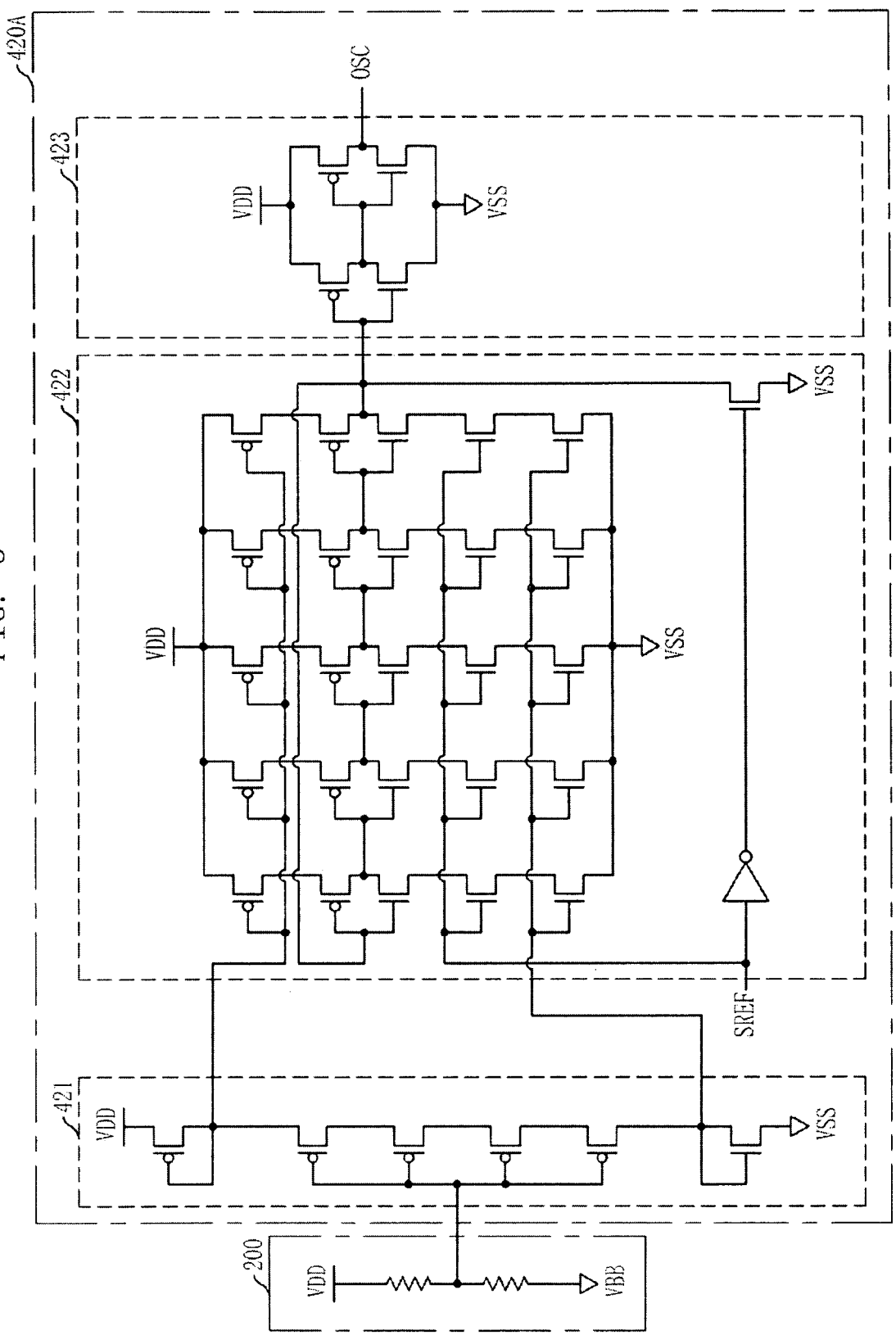
FIG. 5 illustrates an internal circuit diagram of a first embodiment of the voltage level feedback circuit and the refresh period signal generator of FIG. 4.

FIG. 5 illustrates an internal circuit diagram of a first embodiment of the voltage level feedback circuit 200 and the refresh period signal generator 420 shown in FIG. 4.

Referring to FIG. 5, there are provided the voltage level feedback circuit 200 for voltage-dividing a voltage difference between the power supply voltage VDD and the internal power VBB to output the feedback signal, and a refresh period signal generator 420A including a driving power supplier 421 for supplying driving powers with levels adjusted depending on the level of the feedback signal, an oscillator 422 for adjusting a period of the period signal OSC_OUT depending on the levels of the driving powers during activation of the self refresh interval signal SREF, and a pulse output circuit 423 for generating the period signal OSC_OUT as the period-pulse signal PL_FLG of pulse type.

The driving power supplier 421 is provided with a plurality of PMOS transistors which receive the feedback signal via a common gate end and are connected in series between the power supply voltage VDD and the ground voltage VSS.

In operation, the turn-on operation of the PMOS transistors is adjusted by the voltage level of the feedback signal so that the levels of the driving powers which are divided and outputted by the PMOS transistors are different from each other. That is, the driving power supplier 421 adjusts the levels of the driving powers in accordance with the voltage level of the feedback signal and then outputs the adjusted driving powers.

Next, the oscillator 422 adjusts the period of the period signal OSC_OUT in accordance with the level of the driving power of the self refresh interval signal SREF and then outputs the adjusted period signal, and the pulse output circuit 423 outputs the period signal OSC_OUT as the period-pulse signal PL_FLG of pulse type.

A further description will be given in connection with the level of the internal power VBB. First, when the level of internal power VBB drops, the level of the feedback signal of the voltage level feedback circuit 200 drops and therefore the level of the driving power rises to make the period of the period-pulse signal PL_FLG shorter. That is, the reduction in period of the period-pulse signal PL_FLG means that of the internal refresh signal REFP created in response to the above, to thereby increase the number of times of refresh execution.

On the other hand, when the internal power VBB rises, the level of the feedback signal rises and therefore the level of driving power drops, to make the period of the period-pulse signal PL_FLG longer. Thus, the number of times of internal refresh signal REFP being activated by the period-pulse signal PL_FLG is reduced, which renders the number of times of refresh performed during the self refresh mode decreased.

Therefore, the semiconductor memory device including the voltage level feedback circuit 200 and the refresh period signal generator 420A according to the first embodiment adjusts the period of refresh performed during the self refresh mode depending on the level of the internal power VBB.

Figure 6:
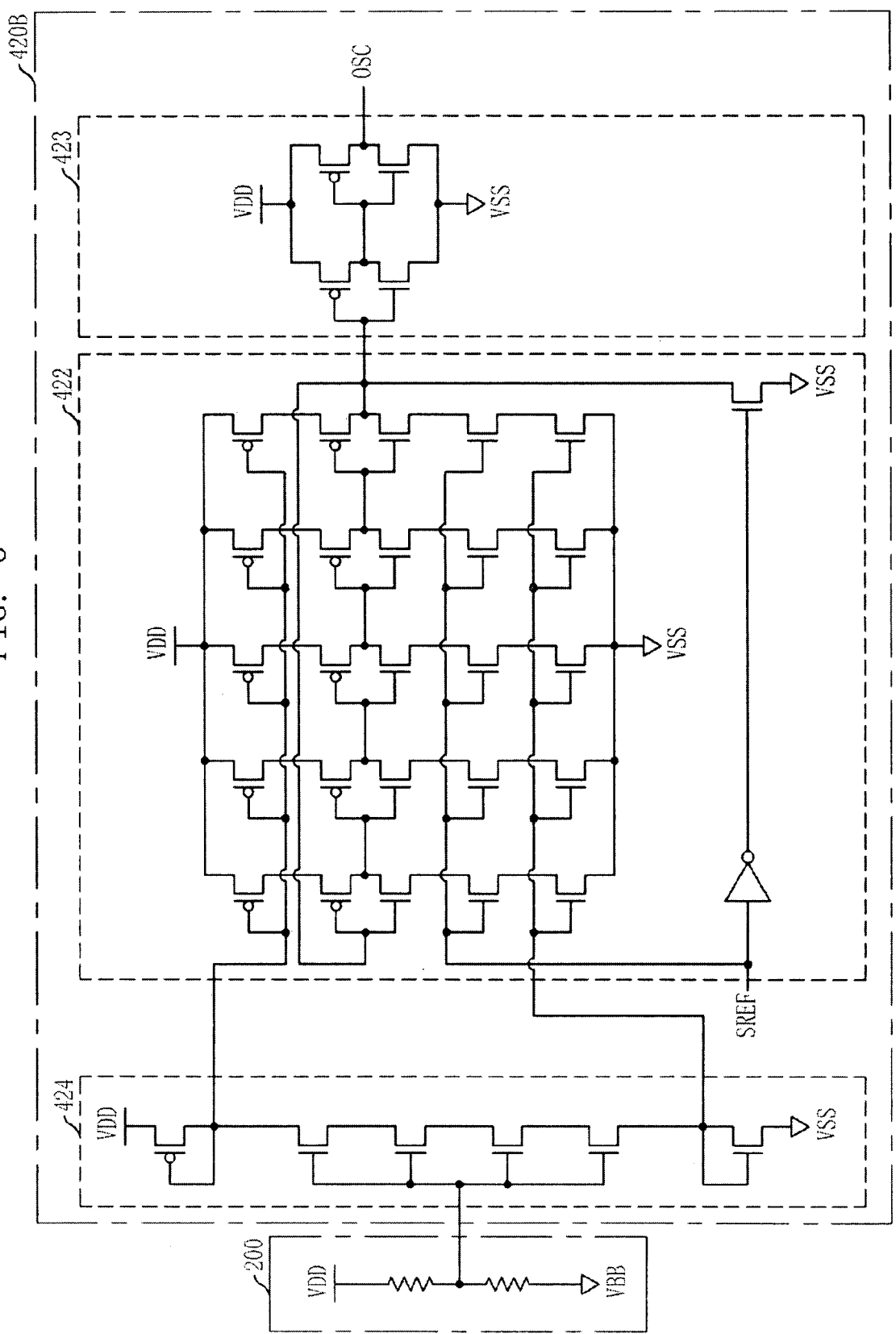
FIG. 6 is an internal circuit diagram of a second embodiment of the voltage level feedback circuit and the refresh period signal generator.

FIG. 6 illustrates an internal circuit diagram of the voltage level feedback circuit 200 and a refresh period signal generator 420B in accordance with a second embodiment of the invention.

Comparing this with the first embodiment shown in FIG. 5, it can be seen that the implementation of the driving power supplier 424 is different. That is, the driving power supplier 424 is provided with a plurality of NMOS transistors which take the feedback signal via a common gate end and are connected in series between the power supply voltage VDD and the ground voltage VSS.

More specifically, it can be seen that the second embodiment substitutes the PMOS transistors with the NMOS transistors in the driving power supplier 424. Thus, the level variation of the driving power caused by the level variation of the internal power VBB is opposite to that in the first embodiment.

The following is a brief description for driving depending on the level of the internal power VBB.

First of all, when the level of the internal power VBB drops, the level of the feedback signal of the voltage level feedback circuit 200 drops and the level of the driving power by the driving power supplier 424 drops. Thus, the period of the period-pulse signal PL_FLG becomes longer. In other words, the increase in period of the period-pulse signal PL_FLG means the increase in interval of the internal refresh signal REFP created in response to the above, which renders the number of times of refresh execution reduced.

On the other hand, when the level of the internal power VBB rises, the level of the feedback signal rises and the level of the driving power rises, to make the period of the period-pulse signal PL_FLG shorter. Thus, the number of times of the internal refresh signal REFP being activated by the period-pulse signal PL_FLG is increased, which renders the number of times of refresh executed during the self refresh mode increased.

Figure 7:
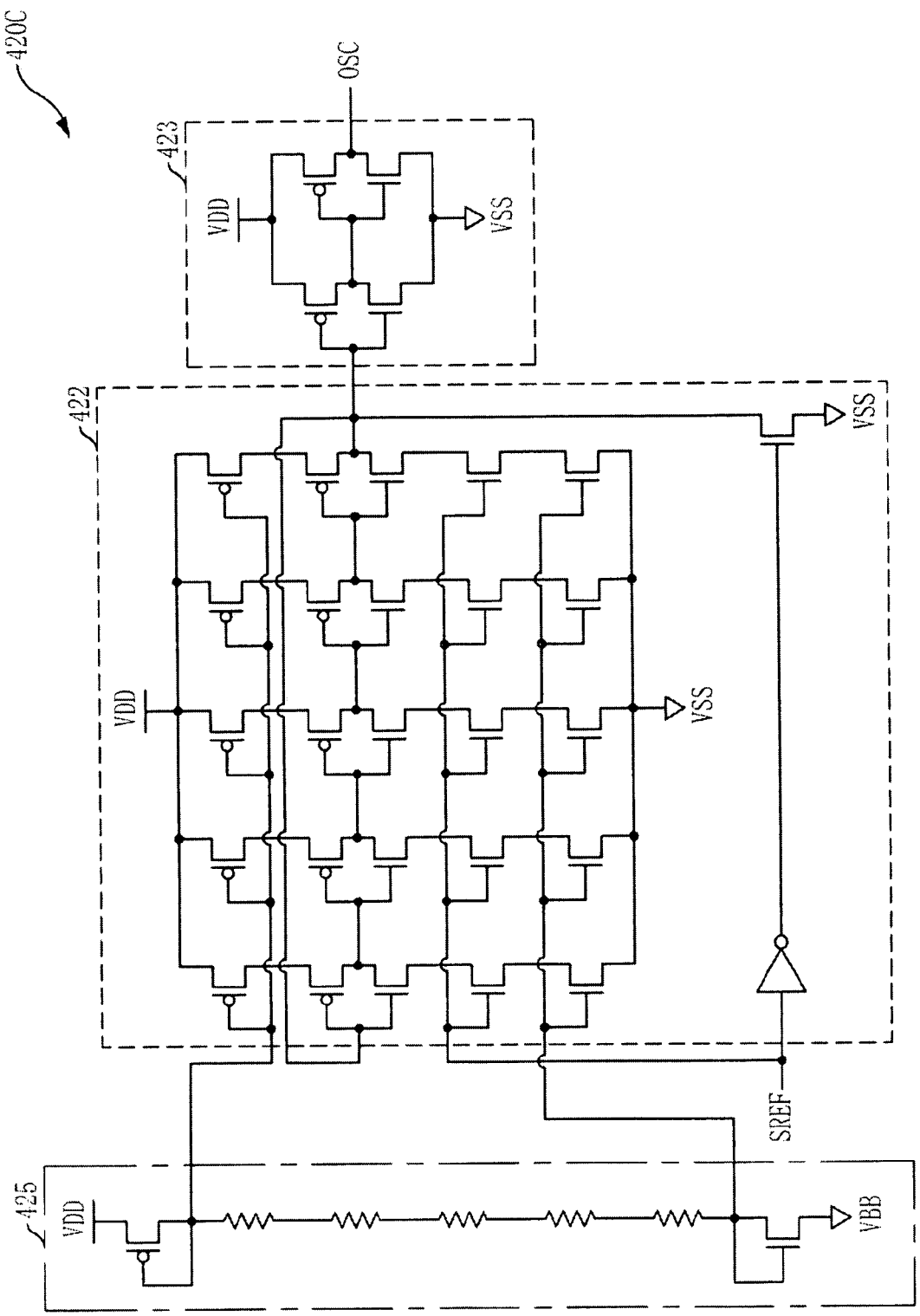
FIG. 7 is an internal circuit diagram of a refresh period signal generator in the semiconductor memory device in accordance with another embodiment of the invention.

FIG. 7 illustrates an internal circuit diagram of a refresh period signal generator 420C in the semiconductor memory device in accordance with another embodiment of the invention.

As shown in FIG. 7, a driving power supplier 425 in the refresh period signal generator 420C is provided with a plurality of resistors coupled in series between the power supply voltage VDD and the internal power VBB. Therefore, the driving power supplier 425 directly takes the internal power VBB and performs the same role as that of the voltage level feedback circuit 200 and the driving power suppliers 421 and 424 shown in FIGS. 5 and 6.

Thus, the semiconductor memory device including the refresh period signal generator 420C shown in FIG. 7 does not have the voltage level feedback circuit separately.

Meanwhile, the level variation of the driving power by level variation of the internal power VBB is the same as the case depicted in FIG. 5. Further, the adjustment of the number of times of refresh execution by the level variation of the driving power is also the same as the case in FIG. 5.

As mentioned earlier, the level of the internal power VBB drops, and thus, if junction-current component is larger than off-current, the use of circuit shown in FIG. 5 or 7 is possible. Further, the level of the internal power VBB drops, and thus, if decreased off-current is more than increased junction-current, the use of circuit shown in FIG. 6 is possible.

Therefore, the semiconductor memory device in accordance with the invention can adjust the number of times of refresh by automatically coping with the level variation of the internal power VBB. In other words, the number of times of refresh execution is adjusted by sensing, through the level variation of the internal power VBB, a case where cell retention time varies as the level variation of the internal power VBB applied as bulk voltage of the cell transistor. Thus, power consumption during the refresh mode can be minimized by adjusting the refresh period in accordance with the level of the internal power.

As a result, the present invention can automatically cope with the level variation of the internal voltage VBB and thus adjust the refresh period, thereby minimizing power consumption during the refresh mode.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device, comprising:
   a level feedback circuit for outputting a bulk voltage applied to a cell transistor as a feedback signal; and
   a refresh signal generator for generating an internal refresh signal for driving a refresh operation at predetermined intervals during a self refresh mode, wherein a period of the internal refresh signal is adjusted according to a voltage level of the feedback signal in an analog method,
   wherein the level feedback circuit includes resistors connected in series between a power supply voltage and the bulk voltage, and a voltage level difference between the power supply voltage and the bulk voltage is voltage-divided and outputted as the feedback signal.

2. The semiconductor memory device as recited in claim 1, wherein the refresh signal generator includes:
   a refresh entrance/exit controller for generating a self refresh interval signal notifying that a current operation is in a self refresh mode based on a clock enable signal and an auto refresh command; and
   a control signal generator for periodically generating an internal refresh signal and an internal address for refresh driving during activation of the self refresh interval signal, wherein an activation period of the internal refresh signal is varied and generated in response to a level of the feedback signal.

3. The semiconductor memory device as recited in claim 2, wherein the control signal generator includes:
   a refresh period signal generator for periodically outputting a period-pulse signal during activation of the self refresh interval signal, wherein a period of the period-pulse signal is adjusted in response to a level of the feedback signal;
   an internal refresh signal generator for periodically outputting an internal refresh signal during activation of the self refresh interval signal, wherein the internal refresh signal is activated in response to the period-pulse signal;
   an internal address counter for increasing a row address by one bit unit in response to the internal refresh signal, to output the internal address.

4. The semiconductor memory device as recited in claim 3, wherein the refresh period signal generator includes:
   a driving power supplier for supplying driving powers with levels adjusted depending on a voltage level of the feedback signal;
   an oscillator which is active in response to the driving powers and adjusts a period of a period signal during activation of the self refresh interval signal to output an adjusted period signal; and
   a pulse generator for generating the period-pulse signal of pulse type whenever the period signal is activated.

5. The semiconductor memory device as recited in claim 4, wherein the driving power supplier is provided with a plurality of PMOS transistors which receive the feedback signal via a common gate end and are connected in series between an external power source and a ground voltage.

6. The semiconductor memory device as recited in claim 4, wherein the driving power supplier is provided with a plurality of NMOS transistors which receive the feedback signal via a common gate end and are connected in series between an external power source and a ground voltage.

7. A semiconductor memory device, comprising:
   a level feedback circuit for outputting a bulk voltage applied to a cell transistor as a feedback signal;
   a refresh entrance/exit controller for generating a self refresh interval signal notifying that the current operation is in a self refresh mode based on a clock enable signal and an auto refresh command; and
   a control signal generator for periodically generating an internal refresh signal and an internal address for refresh driving during activation of the self refresh interval signal, wherein an activation period of the internal refresh signal is varied and generated in response to a level of the bulk voltage applied to a cell transistor,
   wherein the level feedback circuit includes resistors connected in series between a power supply voltage and the bulk voltage, and a voltage level difference between the power supply voltage and the bulk voltage is voltage-divided and outputted as the feedback signal to the control signal generator.

8. The semiconductor memory device as recited in claim 7, wherein the control signal generator includes:
   a refresh period signal generator for periodically outputting a period-pulse signal during activation of the self refresh interval signal, wherein a period of the period-pulse signal is adjusted in an analog method in response to a level of the bulk voltage;
   an internal refresh signal generator for periodically outputting an internal refresh signal during activation of the self refresh interval signal, wherein the internal refresh signal is activated in response to the period-pulse signal;
   an internal address counter for increasing a row address by one bit unit in response to the internal refresh signal, to output the internal address.

9. The semiconductor memory device as recited in claim 8, wherein the refresh period signal generator includes:

a driving power supplier for supplying driving powers with levels adjusted depending on a voltage level of the bulk voltage;

an oscillator which is active in response to the driving powers and adjusts a period of a period signal during activation of the self refresh interval signal to output an adjusted period signal; and a pulse generator for generating the period-pulse signal of pulse type whenever the period signal is activated.

10. The semiconductor memory device as recited in claim 9, wherein the driving power supplier is provided with a plurality of resistors connected in series between an external voltage and the bulk voltage, and outputs voltages divided by the plurality of resistors as first and second driving voltages.

11. A driving method of a semiconductor memory device, comprising:

activating a self refresh interval signal notifying that a current operation is in a self refresh mode in response to a clock enable signal and an auto refresh command, and entering the self refresh mode;

voltage-dividing a bulk voltage applied to a memory cell to feedback a divided bulk voltage; and generating an internal refresh signal and an internal address for controlling refresh driving at a period adjusted in an analog method depending on a level of the feedback voltage during activation of the self refresh interval signal.

* * * * *